(12) United States Patent
Chung

(10) Patent No.: US 7,012,827 B2
(45) Date of Patent: Mar. 14, 2006

(54) MULTIPLE ELECTRICAL FUSES SHARED WITH ONE PROGRAM DEVICE

(75) Inventor: Shine Chien Chung, Sanchung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/029,431

(22) Filed: Jan. 5, 2005

(65) Prior Publication Data

US 2005/0249014 A1 Nov. 10, 2005

Related U.S. Application Data

(60) Provisional application No. 60/568,923, filed on May 5, 2004.

(51) Int. Cl.
  *G11C 7/00* (2006.01)
(52) U.S. Cl. .................................. 365/94; 365/96
(58) Field of Classification Search .............. 365/94, 365/96, 189.02, 230.02
  See application file for complete search history.

(56) References Cited

U.S. PATENT DOCUMENTS

| | | | | |
|---|---|---|---|---|
| 5,675,547 | A | * | 10/1997 | Koga ..................... 365/230.03 |
| 5,812,466 | A | * | 9/1998 | Lee et al. ................... 365/200 |
| 6,775,175 | B1 | * | 8/2004 | Thomas ...................... 365/149 |
| 2004/0066695 | A1 | * | 4/2004 | Anand et al. ............. 365/225.7 |

* cited by examiner

*Primary Examiner*—Vu A. Le
(74) *Attorney, Agent, or Firm*—Duane Morris LLP

(57) ABSTRACT

A method and apparatus is disclosed for sharing multiple fuses with a programming device. A fuse circuit embodying features of the present invention comprises one or more one-time programmable electrical fuses coupled in parallel, a programming device coupled to the fuses, and a selection module coupled to the fuses for selecting a predetermined fuse, wherein upon a selection by the selection module, a programming voltage is imposed for inducing a programming current through the predetermined fuse.

27 Claims, 7 Drawing Sheets

MULTIPLE ELECTRICAL FUSES SHARED WITH ONE PROGRAM DEVICE

CROSS REFERENCE

The present application claims the benefits of U.S. Provisional Patent Application Ser. No. 60/568,923, which was filed on May 5, 2004, and entitled "Electrical Fuse with One Program Device and Multiple Fuses."

BACKGROUND

The present invention relates generally to integrated circuit designs, and more particularly to methods and apparatuses for implementing multiple electrical fuses in a fuse cell equipped with only one programming device.

Electrical fuses are often utilized for modern semiconductors. Typically, they are designed to blow when a current through the fuses exceeds a pre-determined threshold. When the fuses are programmed or "blown", although not necessarily physically broken, they enter into a high impedance state. Electrical fuses are commonly used for making adjustments and repairs that are performed as late as after the chip is packaged. Since wirings are allowed at the two ends of the fuses, the fuses can be flexibly positioned within the chip, which is much more desirable than the conventional laser fuses as it is impossible to implement many metal layers or thick dielectrics above the laser fuses. This flexibility makes electrical fuses a desirable component for higher density memory devices.

However, conventional methods of programming electrical fuses in a memory device are not very efficient in utilizing precious silicon area and thus are costly. For example, conventional methods for programming an electrical fuse require that one programming device is assigned for each fuse. In order to program an electrical fuse, a large supply current is necessary to be directed through the fuse. In order to provide this large supply current, programming devices attached to the fuses are very large. As the number of electrical fuses increase, the number of these large programming devices also increases proportionally. The result is a very poor rate of silicon area utilization.

It is always desirable to provide an improved programming mechanism with multiple fuses to improve silicon area utilization without causing deterioration to operational performance.

SUMMARY

In view of the foregoing, this invention provides paratuses and methods to allow multiple electrical fuses to share a single programming device.

A method and apparatus is disclosed for sharing multiple fuses with a programming device. A fuse circuit embodying features of the present invention comprises one or more one-time programmable electrical fuses coupled in parallel, a programming device coupled to the fuses, and a selection module coupled to the fuses for selecting a predetermined fuse, wherein upon a selection by the selection module, a programming voltage is imposed for inducing a programming current through the predetermined fuse.

The construction and method of operation of the invention, however, together with additional objects and advantages thereof will be best understood from the following description of specific embodiments when read in connection with the accompanying drawings.

DESCRIPTION

The present invention provides apparatuses and methods for allowing multiple fuses to share a single program device within a fuse cell to save silicon area. The present invention proposes the idea of grouping multiple fuses in a fuse cell to share a single programming device. Since programming is only performed on one fuse at a time, it is not necessary to have a programming device for each fuse. By implementing a selection mechanism to select which fuse is to be programmed within a fuse cell, the number of program devices can be reduced dramatically since multiple electrical fuses can share one programming device.

Detail descriptions for embodiments of this invention will show how this invention can work in a one- or two-dimensional array of fuse cells. Methods of implementing sense amplifiers within the fuse cells to allow logic state data output are also demonstrated to further show how, by allowing multiple electrical fuses to share a single programming device, silicon area may be better utilized without causing deterioration to operational performance.

Figure 1B:
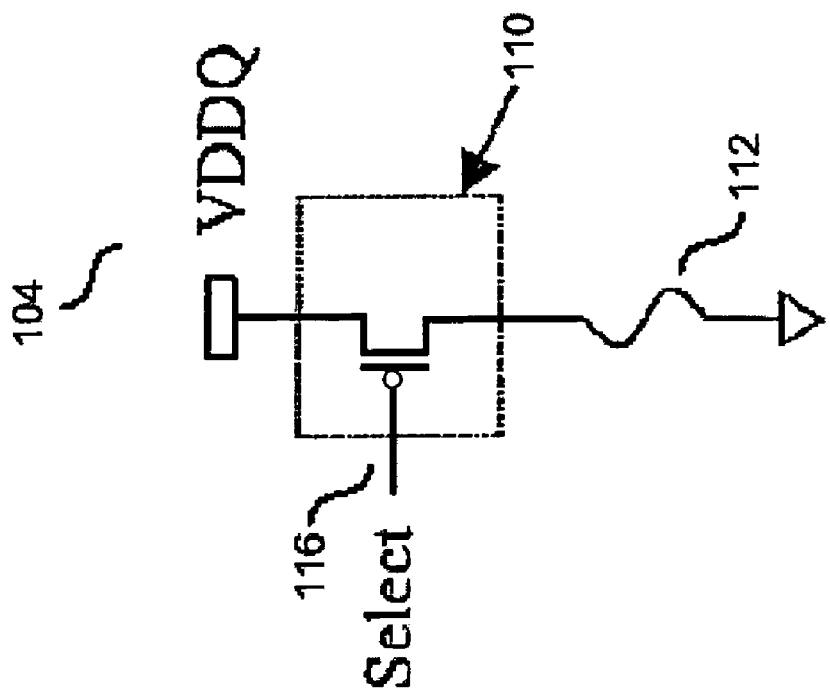
FIGS. 1A and 1B present two schematic diagrams showing conventional fuse cell programming methods.
Figure 1A:
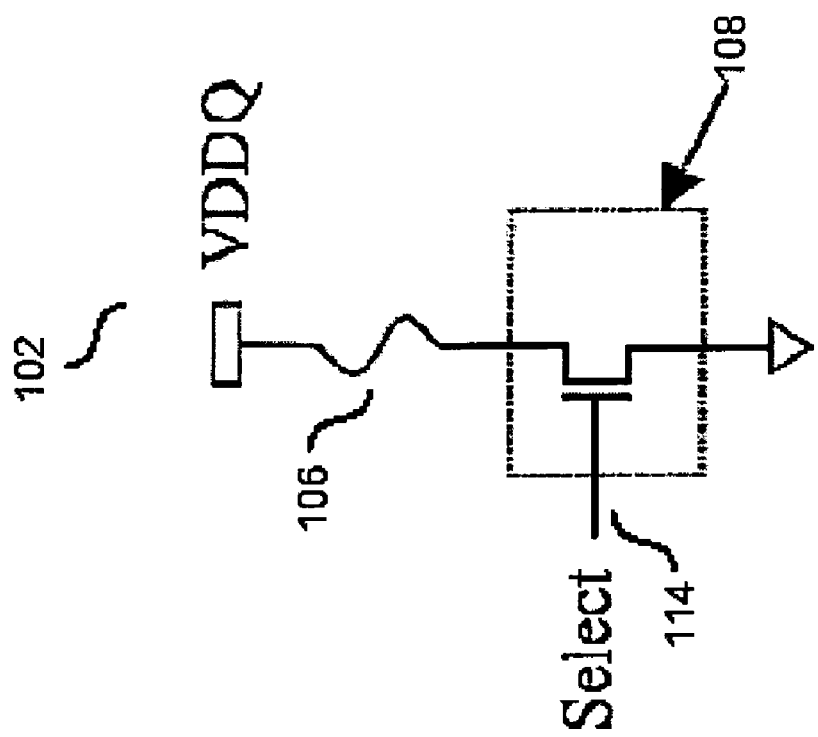

FIG. 1A presents a schematic diagram 102 showing how an electrical fuse is programmed using a NMOS programming device, while FIG. 1B presents a schematic diagram 104 showing how an electrical fuse is programmed using a PMOS programming device. In the schematic diagram 102, an electrical fuse 106 is placed between a NMOS programming device 108 and a high voltage source VDDQ. In the schematic diagram 104, a PMOS programming device 110 is placed between an electrical fuse 112 and a high voltage source VDDQ. A "Select" control signal enters through either a select line 114 or a select line 116, when either the electrical fuse 106 or 112 is assigned to be programmed.

The programming devices 108 and 110 are large in physical size since large currents are required to program electrical fuses, such as the electrical fuses 106 and 112. The conventional method of programming electrical fuses requires one program device for each fuse. This method is extremely inefficient and costly since each fuse requires a separate programming device. In a large array of fuses, the large programming devices will take up massive area within a silicon environment.

Figure 2A:
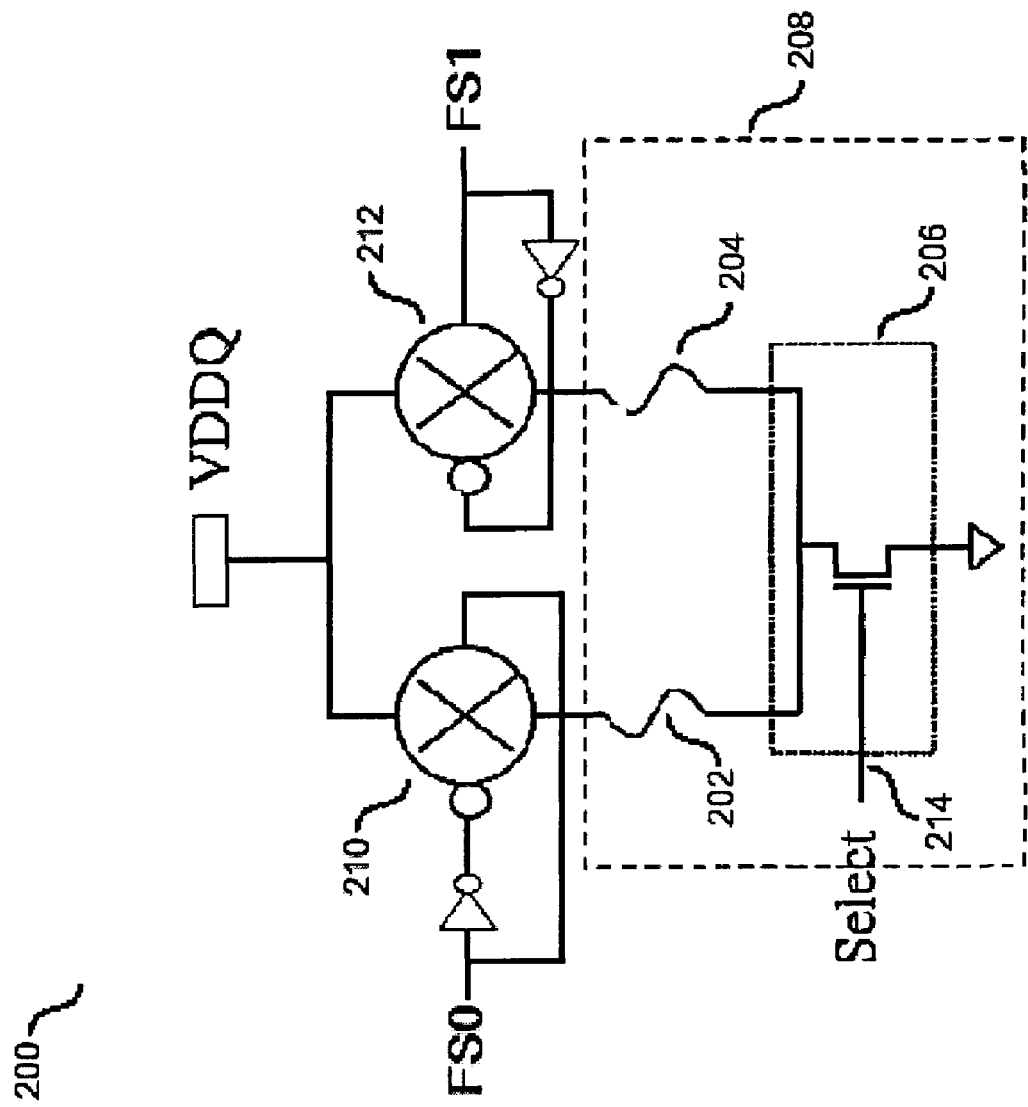
FIGS. 2A to 2D present four schematic diagrams detailing various single-fuse cell implementations in accordance with the first through the fourth embodiments of the present invention.

FIG. 2A presents a schematic diagram 200 showing how two electrical fuses 202 and 204 share a single programming device 206 within a fuse cell 208 in accordance with the first embodiment of the present invention. Both electrical fuses 202 and 204 are connected to a high voltage source VDDQ through a selection module such as multiplexers 210 and 212, respectively. When the electrical fuse 202 or 204 needs to be programmed, a programming selection signal will enter through a "Select" line 214, commanding the programming device 206 to program one of the electrical fuses. Control signals coming in through the fuse select lines such as two fuse selection signals FS0 and FS1 will enter the multiplexers 210 and 212 to close one of the multiplexers, thereby allowing one of the electrical fuses to be programmed.

For example, if the electrical fuse 202 needs to be programmed, the high voltage source VDDQ will rise in order to provide enough current to break the electrical fuse 202. Control signal will enter the programming device 206 through the "Select" line 214 and command it to program the electrical fuse 202 by turning on, in this example, the NMOS transistor within the programming device 206. Incoming signals will also appear at the fuse select line FS0, which commands the multiplexer 210 to close. This opens up a path for the high voltage source VDDQ to provide the current necessary to program the electrical fuse 202.

While to programming device 206 is shown to be a single NMOS device, it is nevertheless understood by those skilled in the an that the programming device 206 may have other NMOS-type or PMOS-type configurations. In addition, the multiplexers 210 and 212 may also be NMOS-type, PMOS-type, or CMOS-type, without deviating from the spirit of this invention. In fact, the multiplexers 210 and 212 can be combined into one multiplexer in this embodiment with the fuse selection signal FS0 and FS1 complementary to each other so that the programming current is either passing through the fuse 202 or 204 at any round of programming. In essence, the function of the selection module is to allow VDDQ to be coupled to one and only one predetermined fuse at any particular round of programming. To meet this need, the selection module is essentially an N-to-one multiplexer where "N" is the total number of fuses the fuse cell. In the simplest example, each fuse is controlled by one fuse selection signal and one multiplexer.

Figure 2B:
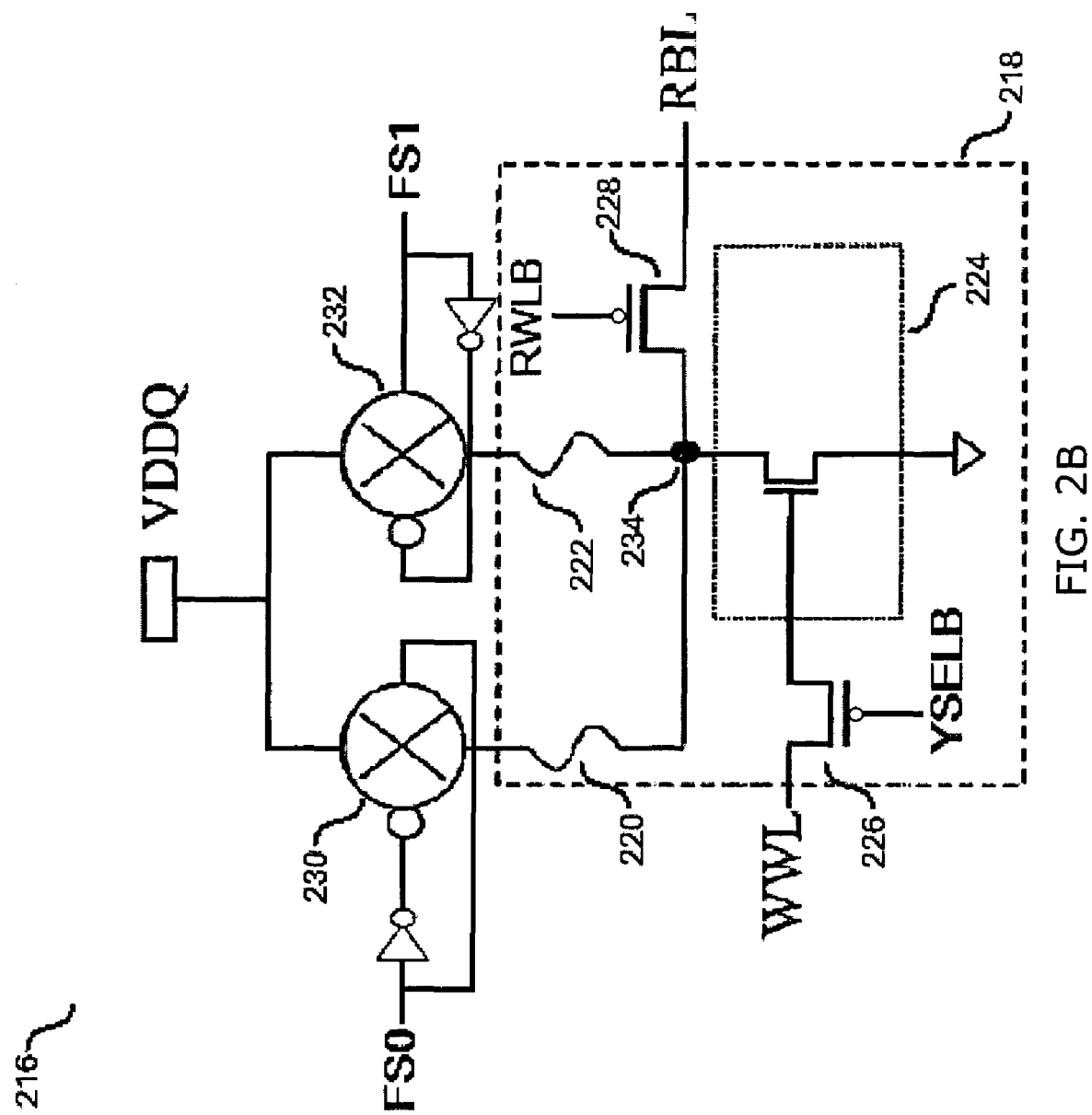

FIG. 2B presents a schematic diagram 216 showing how two electrical fuses 220 and 222 share a single programming device 224 within a fuse cell 218 in accordance with the second embodiment of the present invention. The fuse cell 218 is implemented with an input select device 226 and an output select device 228 to allow the construction of a one- or two-dimensional fuse array. The electrical fuses 220 and 222 are also connected to the high voltage source VDDQ through, respectively, multiplexers 230 and 232, which are controlled, respectively, by fuse signal lines FS0 and FS1.

For example, when the electrical fuse 222 needs to be programmed, a Y-select line (YSELB) will provide a low signal to command the input select device 226 to turn on, thereby allowing a high input signal from a write wordline (WWL) to enter the programming device 224 and turning on, in this example, the NMOS transistor therein. The control signal from the fuse signal line FS1 will close the multiplexer 232, thereby allowing the high voltage source VDDQ to provide the current necessary for the programming device 224 to program the electrical fuse 222.

It is also possible to read data by ensuring that the NMOS transistor in the programming device 224 is off and by inputting a low signal through a read wordline (RWLB) to turn on the output select device 228. This can allow the signal (e.g., an electrical parameter value) at a node 234 to output through a read bit line (RBL). For example, if the electrical fuse 222, which is previously programmed, needs to be checked to ensure that it is properly programmed, the fuse select line FS1 can input a signal to close the multiplexer 232. Since the electrical fuse 222 has already been blown due to previous programming, the high voltage source VDDQ will be hard to reach the node 234. As such, RBL will have a low output. To check the electrical fuse 220, the fuse select line FS0 will need to input a signal to close the multiplexer 230. This allows the high voltage supply VDDQ to reach the node 234, thereby providing a high signal output to RBL.

While the electrical fuses 220 and 222 are shown to connect to the programming device 224 which contains an NMOS transistor, it is nevertheless understood by those skilled in the art that that PMOS-type devices may also be used as a programming device for this invention, whereas input and output select devices 226 and 228 can also be NMOS-type, PMOS-type, or zero threshold transistors (i.e., zero-$V_t$ MOS devices) within the scope of this invention.

Figure 2C:
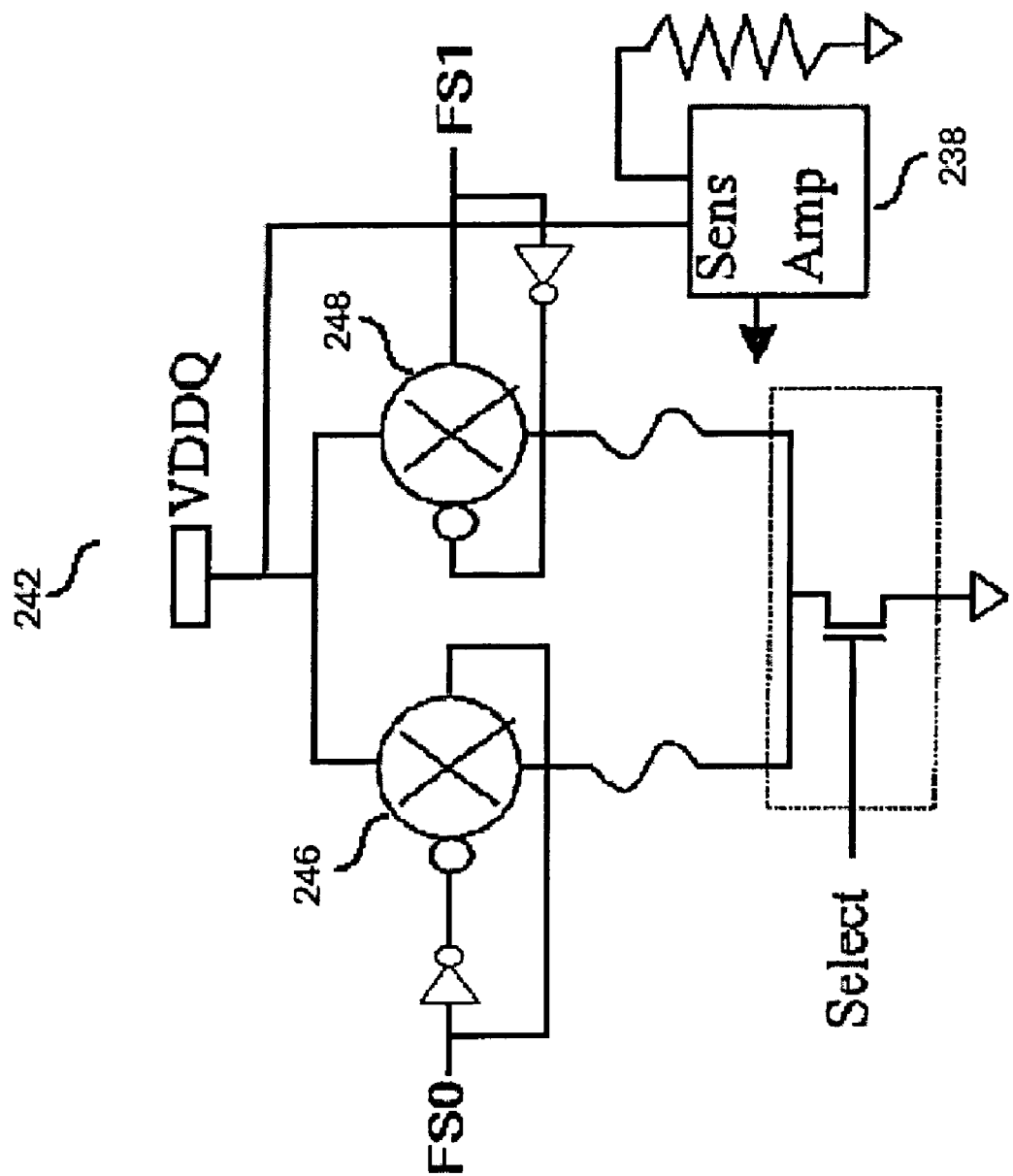

FIG. 2C presents a schematic diagram 242 demonstrating how a sense amplifier 238 may be used to provide an output of data in logic state "0" or "1" rather than resistance values in accordance with the third embodiment of the present invention. This output, as illustrated by the black arrow, is generated by the sense amplifier 238, which detects very small changes in the voltage of bit lines. The schematic diagram 242 is similar to the schematic diagram 200 in FIG. 2A except that the sense amplifier 238, which detects the high voltage source VDDQ, is added. In this embodiment, whether or not the multiplexers 246 and 248 are closed, the sense amplifier 238 provides a logic state output to determine if the fuses are programmed or not.

Figure 2D:
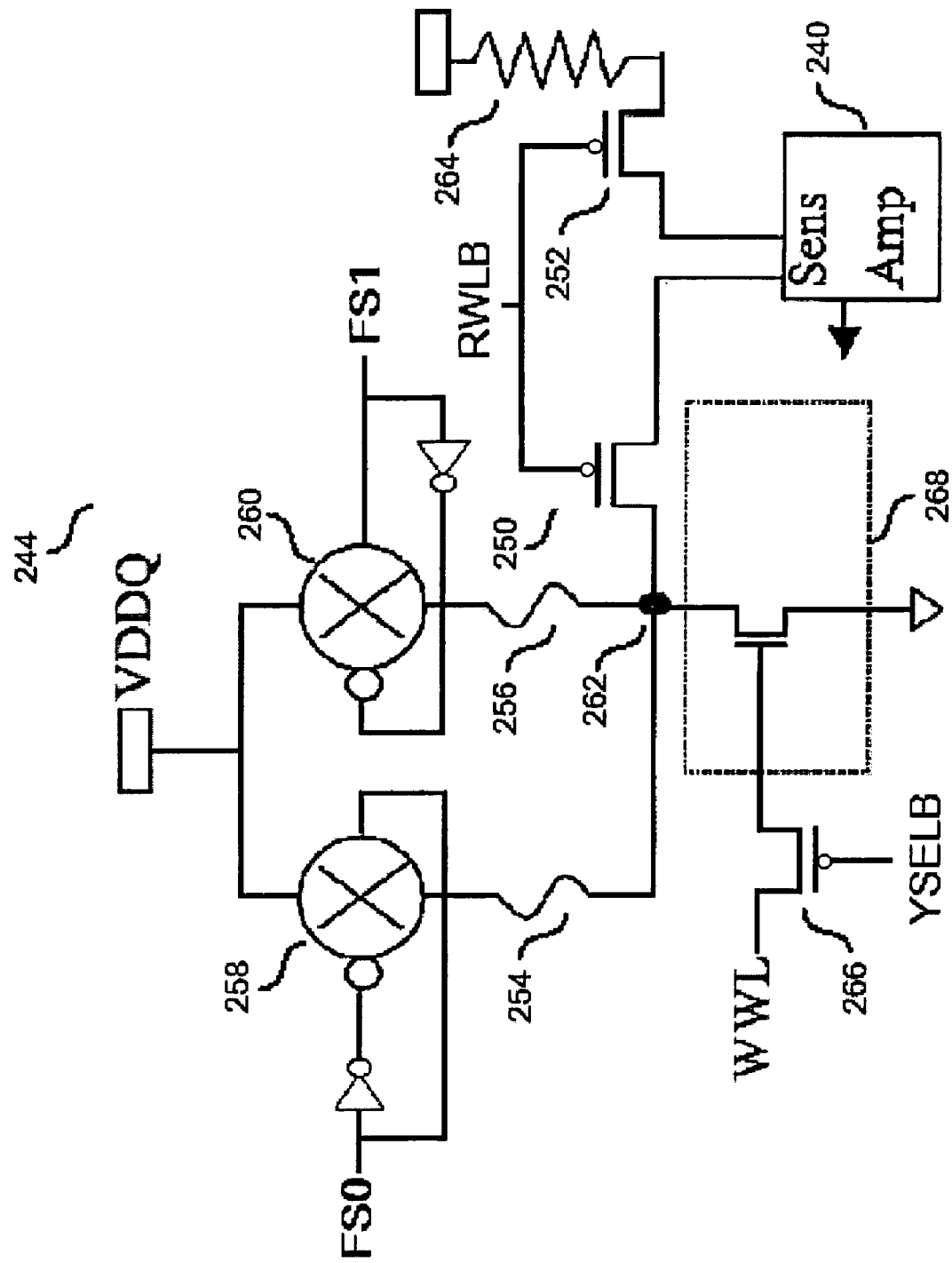

FIG. 2D presents a schematic diagram 244 demonstrating how a sense amplifier 240 may be used to provide an output of RBL, as previously illustrated in FIG. 2B, relative to a pre-determined reference voltage, in accordance with the fourth embodiment of the present invention. The schematic diagram 244 is similar to the schematic diagram 216 except that the sense amplifier 240 is added at the output of an output select device 250. When a signal comes in from a read wordline (RWLB) to turn on the output select device 250 and a PMOS device 252, the sense amplifier 240 will be able to determine the logic state for either one of the two electrical fuses 254 or 256, depending on which of the two multiplexers 258 or 260 is closed.

If the electrical fuse 256 is to be measured for its state, a fuse select line FS1 will command the multiplexer 260 to close, thereby providing a path for voltage to reach the electrical fuse 256. If the electrical fuse 256 has already been broken through previous programming, a node 262 will not have a signal. The RWLB will need to have a low signal in order to turn on the output select device 250 and the PMOS device 252 to allow the sense amplifier 240 to determine if the resistance value at the node 262 is logically high or low in comparison with a reference resistor, 264. By comparing the resistance value of the electrical fuse 256 with a reference resistor 264, the sense amplifier 240 may conclude that the electrical fuse 256 has already been blown and programmed. It is also important for a Y-select line (YSELB) to input a high signal to an input select device 266, thereby turning it off and not allowing any signal to enter a programming device 268 through a write wordline (WWL). This prevents the node 262 from being grounded during the reading process.

Similarly, if the electrical fuse 254, which as an example is non-programmed, the RWLB will again provide a low signal to turn on the output select device 250 and the PMOS device 252 to allow the sense amplifier 240 to operate. The YSELB will input a high signal to the input select device 266 during the reading process to prevent the programming device 268 from turning on, thereby grounding the node 262. The multiplexer 258 will be closed, thus allowing voltage to pass through the electrical fuse 254 to reach the node 262. The sense amplifier 240 will compare the resistance of the electrical fuse 254 with comparison to the reference resistor 264 to determine whether or not the electrical fuse 254 has been blown.

Figure 3A:
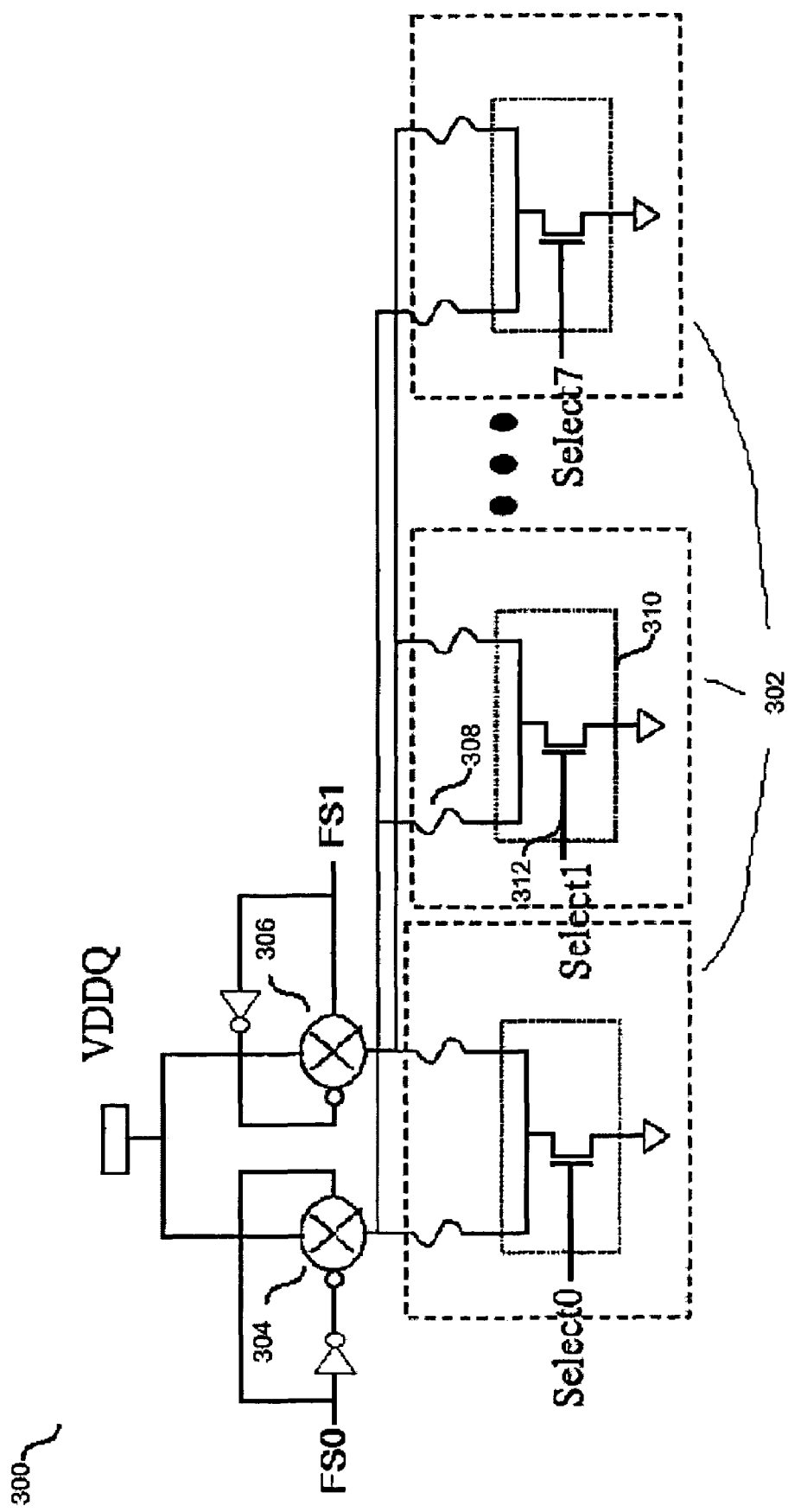
FIGS. 3A and 3B present two schematic diagrams detailing various multiple-fuse cell implementations in accordance with the fifth and the sixth embodiments of the present invention.

Sense amplifiers can also be implemented in fuse cell arrays. FIG. 3A presents a schematic diagram 300 showing a one-dimensional array of 8 fuse cells 302 in accordance with the fifth embodiment of the present invention. The array is set up in an 8-by-1 configuration. The fuse cells 302 are similar to the fuse cell, which allows two electrical fuses to share one programming device. Each electrical fuse is connected to the high voltage source VDDQ through one of the multiplexers 304 or 306, which are respectively controlled by the fuse select lines FS0 and FS1. The fuse cell that needs to be programmed will be selected by "Select" signals 0 through 7. A select line is connected to each programming device within the array of fuse cells 302. By selecting a certain select signal and closing the correct multiplexer, a predetermined electrical fuse can be programmed when the high voltage source VDDQ provides the necessary current for the programming device.

For example, if an electrical fuse 308 is to be programmed, a control signal will enter a programming device 310 through a select line 312 and command it to program the electrical fuse 308 by turning on, in this example, the NMOS transistor within the programming device 310. Incoming signals will also appear at the fuse select line FS0 commanding the multiplexer 304 to close. This opens up a path for the high voltage source VDDQ to provide the current necessary to break the electrical fuse 308.

By implementing fuses cells where two electrical fuses sharing one program device, the number of available fuses is effectively doubled without wasting extra silicon area for larger number of large programming devices. Note that fuse cells used in such array is merely an embodiment of this invention and it can vary since it is not limited to only two fuses per cell. For example a 4-to-1 selection module such as a 4-to-1 multiplexer can be used to select one of four fuses to be programmed at any time. As such, each fuse cell can have four fuses sharing one programming device. Similarly, an x-to-1 selection module combined with a programming device can control "x" number of fuses to be programmed wherein "x" is an integer or most likely an even integer.

Figure 3B:
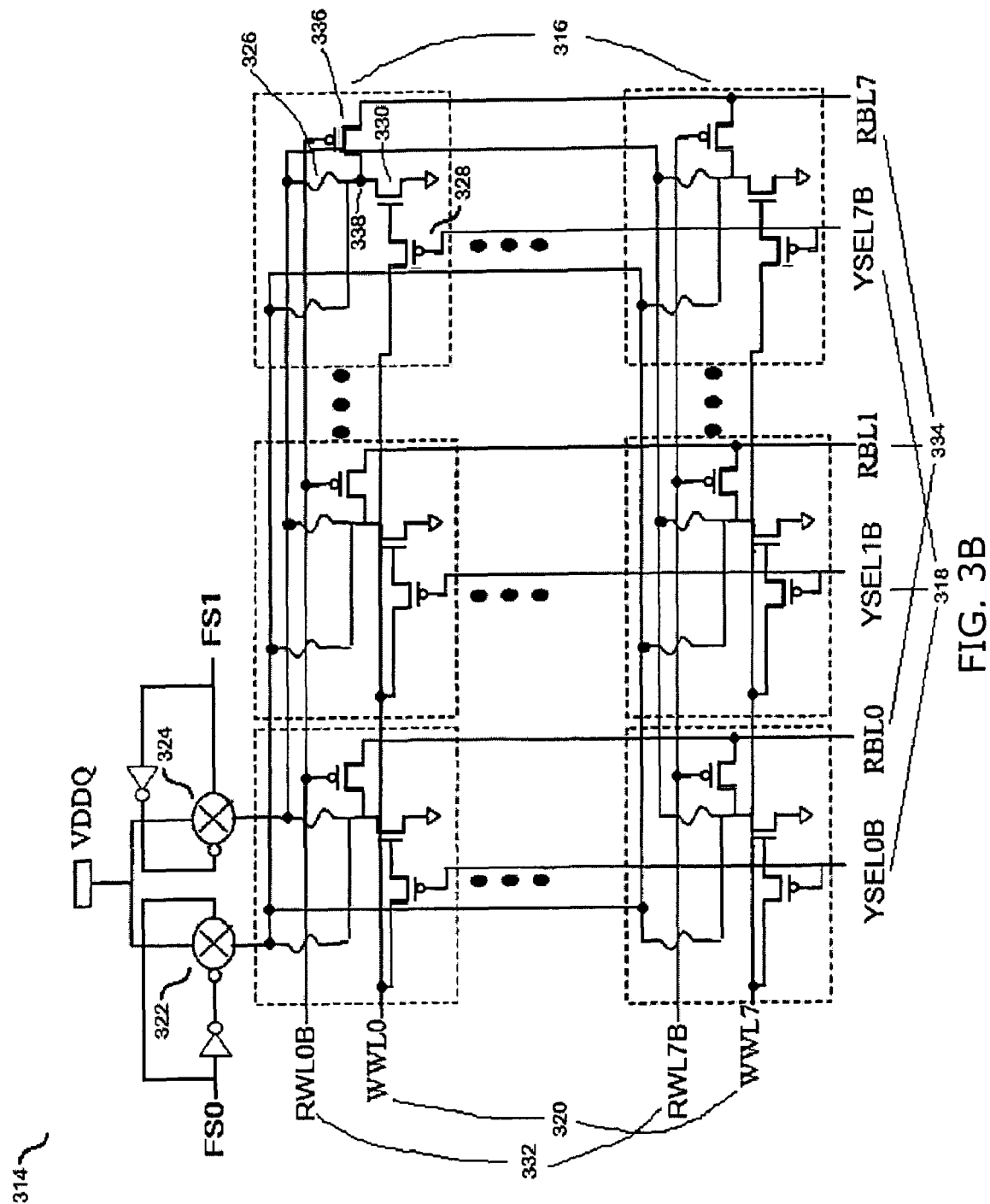

FIG. 3B presents a schematic diagram 314 illustrating a two-dimensional array of 64 fuse cells 316 in accordance with the sixth embodiment of the present invention. The array is set up in an 8-by-8 configuration. All 64 fuse cells are similar to the fuse cell 218 in FIG. 2B, which allows two electrical fuses to share one programming device in each fuse cell. As shown, the 64 fuse cells are arranged in 8 rows and 8 columns as shown. This two-dimensional array is controlled by various selection signals. With incoming signals from various Y-select lines (YSELBs) 318, various write wordlines (WWLs) 320, and fuse select lines FS0 and FS1, an exact electrical fuse can be located for programming. Signals from YSELBs 318 can determine the column location of the fuse cell that contains the electrical fuse that needs to be programmed, while signals from WWLs 320 can determine the row location. The fuse select lines FS0 and FS1 control if either the multiplexer 322 or 324 will close. With the exact fuse cell selected and the correct multiplexer closed, a specific electrical fuse can be located for the programming process.

For example, if an electrical fuse 326 is to be programmed, a Y-select line YSEL7B will provide a low signal to turn on an input select device 328, thus allowing a high input signal from a write wordline (WWL0) to enter a programming device 330. Meanwhile, the control signal from the fuse signal line FS1 will close the multiplexer 324, thus allowing the high voltage source VDDQ to provide the current necessary for the programming device 330 to program the electrical fuse 326.

Since the fuse cells 316 are implemented with both input and output select devices, it is possible to read the state of a certain fuse if specific address of the fuse is provided. RWLs 332 can provide a low signal to turn on the output select devices for a row of fuse cells 316. YSELBs 318 will provide the column location of the certain electrical fuse. With the row and the column location along with a proper signal from the fuse select lines FS0 or FS1, a specific electrical fuse can be precisely located for in a read operation. The results from this reading process may exit through various read bit lines (RBLs) 334.

If the previously programmed electrical fuse 326 is to be read for its state, the read wordline RWL0B will input a low signal, thereby turning on the output select devices of an entire row of the fuse cells 316, including the output select device 336. The Y-select line YSEL7B will assist in locating the specific fuse cell by providing the column address of the fuse cell. The fuse select line FS1 will also command the multiplexer 324 to close. Since the electrical fuse 326 has already been programmed due to previous programming, high voltage supply VDDQ will be hard to reach a node 338. As such, a read bit line RBL7 will have a low output.

The above illustration provides many different embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A fuse circuit comprising:
   one or more one-time programmable electrical fuses;
   a programming device coupled to the electrical fuses; and
   a selection module coupled to the electrical fuses for selecting a predetermined electrical fuse,
   wherein upon a selection by the selection module, a programming voltage is imposed for inducing a programming current through the predetermined electrical fuse,
   wherein the selection module is an N-to-one multiplexer selecting one of the N number of electrical fuses.

2. The circuit of claim 1 wherein the selection module has one or more electrical fuse selection signals each allowing only one fuse to be coupled to the programming voltage.

3. The circuit of claim 1 wherein the electrical fuses are silicided poly fuses.

4. The circuit of claim 1 wherein the programming device is a MOS transistor with its gate controlled by a programming selection signal whose value decides whether the transistor is turned on or off.

5. The circuit of claim 4 further comprising an input select device for providing the programming selection signal.

6. The circuit of claim 5 further comprising an output select device for reading an electrical parameter value at one end of each fuse for detecting an electric parameter thereof.

7. The circuit of claim 6 further comprising a sensing device coupled to the output select device for comparing with a reference resistor for providing a logic state of a predetermined fuse selected by the selection module.

8. The circuit of claim 1 wherein the programming device is an NMOS transistor directly coupled to ground at one end and the fuses at its opposite end.

9. The circuit of claim 1 wherein the programming device is a PMOS transistor directly coupled to the programming voltage at one end and the electrical fuses at its opposite end.

10. A fuse circuit comprising:
   one or more one-time programmable electrical fuses;
   a programming device coupled to the electrical fuses;
   a selection module coupled to the fuses for selecting a predetermined electrical fuse; and
   a sensing device for comparing with a reference device for providing a logic state of the predetermined electrical fuse if selected by the selection module in a reading operation,
   wherein upon a selection by the selection module in a writing operation, a programming voltage is imposed for inducing a programming current through the predetermined electrical fuse,
   wherein the selection module is an N-to-one multiplexer selecting one of the N number of electrical fuses.

11. The circuit of claim 10 wherein the selection module has one or more fuse selection signals each allowing only one fuse to be coupled to the programming voltage.

12. The circuit of claim 10 wherein the electrical fuses are silicided poly fuses.

13. The circuit of claim 10 wherein the programming device is a MOS transistor wit its gate controlled by a programming selection signal whose value decides whether the transistor is turned on or off.

14. The circuit of claim 13 further comprising an input select device for providing the programming selection signal.

15. The circuit of claim 10 further comprising an output select device coupled to the sensing device for selectively allowing the sensing device to access a predetermined end of the electrical fuse.

16. The circuit of claim 10 wherein the reference device is a resistor.

17. A fuse circuit comprising:
   a fuse array having a first number (X) of rows and a second number (Y) of columns of fuse cells, and each fuse cell having one or more programmable electrical fuses;
   a first selection signal for selecting one of the X rows of the fuse cells;
   a second selection signal for selecting one of the Y rows of the fuse cells;
   at least one programming device coupled to more than one fuses; and
   at least one selection module coupled to the electrical fuses in each fuse cell for selecting a predetermined electrical fuse,
   wherein the first and second selection signals identify a predetermined fuse cell to be accessed, and upon a selection by the selection module, a programming voltage is imposed for inducing a programming current through the predetermined fuse.

18. The circuit of claim 17 wherein the selection module is an N-to-one multiplexer selecting one of the N number of fuses in a fuse cell.

19. The circuit of claim 17 wherein the electrical fuses are silicided poly fuses.

20. The circuit of claim 17 wherein the selection module has one or more fuse selection signals each allowing only one electrical fuse to be coupled to the programming voltage.

21. The circuit of claim 17 wherein the programming device is a MOS transistor with its gate controlled by a programming selection signal whose value decides whether the transistor is turned on or off.

22. The circuit of claim 21 further comprising an input select device for providing the programming selection signal.

23. The circuit of claim 22 further comprising an output select device for identifying an electrical parameter value at one end of each fuse for detecting an electric parameter thereof.

24. The circuit of claim 23 further comprising a sensing device coupled to the output select device for comparing with a reference resistor for providing a logic state of a predetermined fuse selected by the selection module.

25. The circuit of claim 17 wherein the programming device is an NMQS transistor directly coupled to ground at one end and the fuses at its opposite end.

26. The circuit of claim 17 wherein the programming device is a PMOS transistor directly coupled to the programming voltage at one end and the fuses at its opposite end.

27. A fuse circuit comprising:
   a fuse cell comprising a plurality of one-time programmable electrical fuses;
   a programming device responsive to a programming selection signal and coupled to more than one of said plurality of fuses in said fuse cell; and
   a selection module coupled to the electrical fuses for selecting a predetermined electrical fuse from said that cell for programming,
   wherein upon a selection by the selection module, a programming voltage is imposed for inducing a programming current through the predetermined electrical fuse.

* * * * *

UNITED STATES PATENT AND TRADEMARK OFFICE
CERTIFICATE OF CORRECTION

PATENT NO. : 7,012,827 B2
APPLICATION NO. : 11/029431
DATED : March 14, 2006
INVENTOR(S) : Shine Chien Chung It is certified that error appears in the above-identified patent and that said Letters Patent is hereby corrected as shown below:

Column 3, line 15, delete first instance of "to" and insert therefor --the--;

Column 3, line 17, delete "an" and insert therefor --art--;

Column 7, line 32, delete "wit" and insert therefor --with--;

Column 8, line 34, delete "NMQS" and insert therefor --NMOS--; and

Column 8, line 47, delete "that" and insert therefor --fuse--.

Signed and Sealed this

Tenth Day of April, 2007

JON W. DUDAS
*Director of the United States Patent and Trademark Office*